US 6,545,540 B1

(12) United States Patent
Enriquez

(10) Patent No.: US 6,545,540 B1
(45) Date of Patent: Apr. 8, 2003

(54) CURRENT MIRROR-EMBEDDED LOW-PASS FILTER FOR SUBSCRIBER LINE INTERFACE CIRCUIT APPLICATIONS

(75) Inventor: Leonel Ernesto Enriquez, Melbourne Beach, FL (US)

(73) Assignee: Intersil Americas Inc., Milpitas, CA (US)

( * ) Notice: Subject to any disclaimer, the term of this patent is extended or adjusted under 35 U.S.C. 154(b) by 216 days.

(21) Appl. No.: 09/686,633

(22) Filed: Oct. 11, 2000

(51) Int. Cl.$^7$ ................................................ H03F 3/04
(52) U.S. Cl. ...................... 330/288; 330/302; 330/306
(58) Field of Search ................................ 330/288, 302, 330/306

(56) References Cited

U.S. PATENT DOCUMENTS 4,645,999 A * 2/1987 Szepesi ...................... 323/315
4,769,619 A * 9/1988 Taylor ......................... 330/288

* cited by examiner

Primary Examiner—Henry Choe
(74) Attorney, Agent, or Firm—Allen, Dyer, Doppelt, Milbrath & Gilchrist, P.A.

(57) ABSTRACT

A current mirror circuit incorporates a resistor-capacitor (RC) filter circuit in the base-coupling path of input and output current mirror transistors, to realize a highly integrated low pass filter current mirror architecture, that reduces implementation complexity, and complies with reduced power supply parameters of a subscriber line interface circuit. A filter resistor is connected in series between the bases of the input and output current mirror transistors. A filter capacitor is coupled between the base of the output transistor and the power supply rail. The effect of this low pass filter circuit is such that the output current is equal to the frequency content of the input current below the cut-off frequency as defined by the RC time constant of the filter.

8 Claims, 1 Drawing Sheet

US 6,545,540 B1

CURRENT MIRROR-EMBEDDED LOW-PASS FILTER FOR SUBSCRIBER LINE INTERFACE CIRCUIT APPLICATIONS

FIELD OF THE INVENTION

The present invention relates in general to communication systems and components, and is particularly directed to new and improved low pass filter-incorporating current mirror circuit architecture, that is readily suited for low voltage, low noise applications, such as, but not limited to subscriber line interface circuits.

BACKGROUND OF THE INVENTION

Systems employed by telecommunication service providers contain what are known as subscriber line interface circuits or 'SLIC's, which interface communication signals with tip and ring leads of a wireline pair serving a relatively remote piece of subscriber communication equipment. In order to be interfaced with a variety of telecommunication circuits, including those providing codec functionality, present day SLICs must conform with a very demanding set of performance requirements, including accuracy, linearity, insensitivity to common mode signals, low noise, low power consumption, filtering, and ease of impedance matching programmability.

One of circuits commonly employed in a variety of SLIC implementations is a current mirror, the basic configuration of a typical one of which is schematically illustrated in FIG. 1. As shown therein, for a bipolar PNP transistor-based architecture, the current mirror comprises a current mirror input PNP transistor 10 and a current mirror output PNP transistor 20. The input transistor 10 has its base 11 coupled to receive a voltage reference $V_{REF}$ through a bias resistor 15, that is coupled to a (VCC) power supply rail 16. The collector 13 of transistor 10 is coupled to an input terminal IN, to which an input current $I_{in}$ is supplied from an associated communication device interfaced therewith. The emitter 12 of the input transistor 10 is coupled through an emitter resistor 14 (having a resistance value $R_{14}$) to the VCC supply rail 16.

In order to mirror the input current supplied to the input terminal IN, the base 11 of the current mirror input transistor 10 is coupled in common with the base 21 of current mirror output PNP transistor 20. It is also coupled to the emitter 32 of a base-offset PNP transistor 30, the collector 33 of which is coupled to a voltage reference terminal, such as ground (GND). The base 31 of PNP transistor 30 is coupled in common to the collector 13 of the current mirror input transistor 10. The emitter 22 of the current mirror output transistor 20 is coupled through an emitter resistor 24 (having a resistance value $R_{24}$) to the (VCC) power supply rail 16, and its collector 23 is coupled to an output terminal OUT, from which a mirrored output current $I_{out}$ is derived.

For the current mirror circuit architecture of FIG. 1 the following loop equation may be written:

$$I_{in}R_{14}/\alpha_{10}+Vbe_{10}=I_{out}R_{24}/\alpha_{20}+Vbe_{20}. \quad (1)$$

As the circuit of FIG. 1 is normally implemented with the input transistor 10 being well matched with the current mirror output transistor 20 ($\alpha_{10}=\alpha_{20}$, and $Vbe_{10}=Vbe_{20}$), and with resistors 14 and 24 being of equal resistance values ($R_{14}=R_{24}$), it follows that:

$$I_{in}=I_{out}. \quad (2)$$

As pointed out above, among the performance requirements of present day SLICs is the need to provide (low pass) filtering. While this can be accomplished by means of a discrete filter circuit to which signal interface path with the SLIC is interfaced, such an approach increases the hardware complexity of the circuit and typically involves the use of power supply rails that provide sufficient overhead voltage. However, as designers of telecommunication integrated circuits, such as codecs and the like, continue to 'lower the voltage supply rail bar' requirements for their devices (e.g., from five volts down to a voltage on the order of three volts or slightly higher), through the use of differential voltage-based implementations, the service provider is faced with the problem that such low voltages restrict voltage headroom.

SUMMARY OF THE INVENTION

With these restrictions in mind, the current mirror circuit of FIG. 1 is modified in accordance with the present invention to incorporate a relatively simple resistor-capacitor (RC) filter circuit in the base-coupling path of the input and output transistors, so as to realize a highly integrated low pass filter current mirror architecture, that not only reduces implementation complexity, but readily complies with the reduced power supply parameters of the SLIC.

In particular, a series resistor is substituted in place of the direct or common connection of the bases of the input and output transistors. In addition, a filter capacitor is coupled between the base of the output transistor and a the VCC supply rail. The effect of this RC circuit is to modify the transfer function of the current mirror to include a low pass filter, such that the output current is equal to the frequency content of the input current below the cut-off frequency as defined by the time constant of the RC filter.

DETAILED DESCRIPTION

Figure 1:
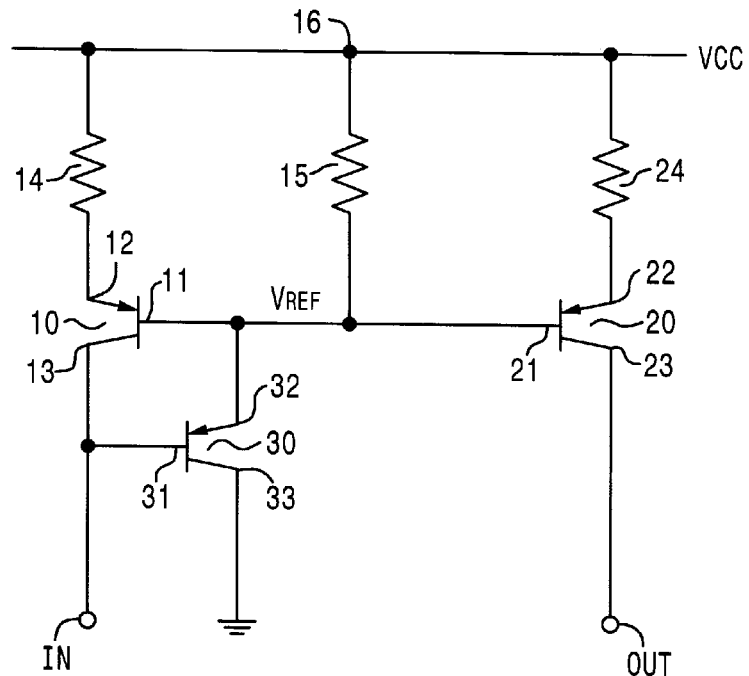
FIG. 1 schematically illustrates the configuration of a conventional current mirror.
Figure 2:
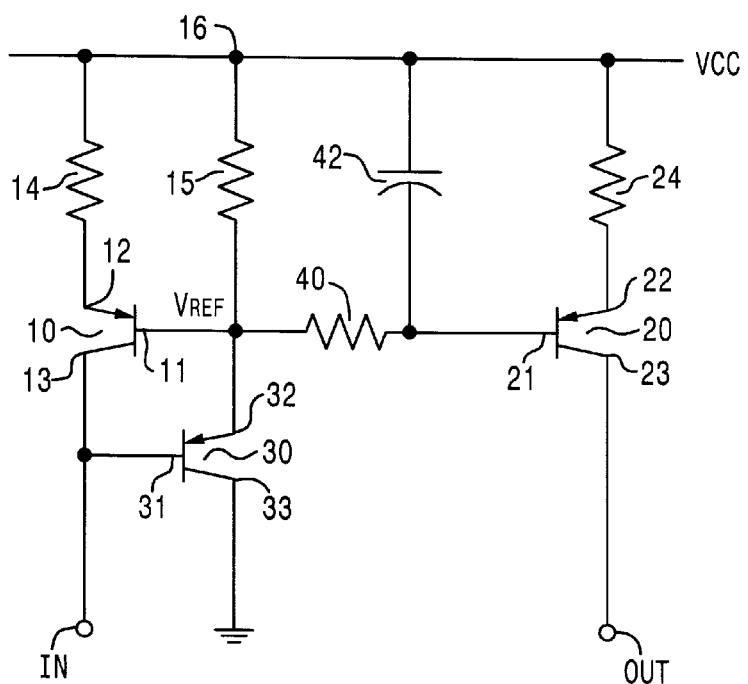
FIG. 2 schematically illustrates the current mirror of FIG. 1 as modified to incorporate an RC-based low pass filter.

FIG. 2 schematically illustrates a modification of the circuit of FIG. 1 to incorporate a resistor-capacitor (RC) filter circuit in the base-coupling path of the input and output transistors 10 and 20, respectively, so as to realize a low pass filter current mirror architecture. Like the circuit of FIG. 1, FIG. 2 shows the invention implemented using bipolar devices; however, it is to be understood that the invention is not limited thereto, but also may be implemented using alternative equivalent components, such as field effect transistors (FETs), for example.

In order to integrate a low pass filter into the current mirror, a resistor 40 (having a resistor value $R_{40}$) is coupled in series between the base 11 of input transistor 10, and a capacitor 42 (having a capacitance value of $C_{42}$) is connected between the base 21 of output transistor 20 and the VCC supply rail 16. The effect of this RC network is to place an RC voltage divider between the base 21 of the output transistor 20 and the base 11 of input transistor 10.

As a consequence, the loop equation (1) for FIG. 1 is modified as follows:

$$[I_{in}R_{14}/\alpha_{10}+Vbe_{10}]*[(1/sC_{42})/(R_{14}+1/sC_{42})]=I_{out}R_{24}/\alpha_{20}+Vbe_{20}=[I_{in}R_{14}/\alpha_{10}+Vbe_{10}]*[1/(1+sR_{14}C_{42})]. \quad (2)$$

From equation (2) it can be seen that the output current $I_{out}$ provided at the output terminal OUT of the circuit of FIG. 2 is equal to the frequency content of the input current $I_{in}$, as long as the frequency content of the input current $I_{in}$ is below the cut-off frequency defined by the time constant $R_{14}C_{42}$ of the RC filter. Thus, the current mirror circuit of FIG. 2 provides a relatively low complexity implementation of a current mirror-based low pass filter, that may be readily incorporated in variety of low voltage communication circuits, such as present day subscriber line interface circuits, which have limited voltage headroom.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all changes and modifications as are obvious to one of ordinary skill in the art.

What is claimed is:

1. A current mirror circuit comprising:

an input port adapted to receive an input current;

an output port adapted to provide an output current;

a current mirror input transistor having an input electrode coupled through a resistor to a voltage supply terminal, a control electrode coupled to receive a reference voltage, and an output electrode coupled to said input port;

a current mirror output transistor having an input electrode coupled through a resistor to said voltage supply terminal, an output electrode coupled to said output port, and a control electrode; and a resistor-capacitor low pass filter circuit installed in a control electrode-coupling path between said current mirror input and output transistors, and comprising a resistor coupled in series between the control electrode of said current mirror input transistor and the control electrode of said current mirror output transistor, and a capacitor directly connected between the control electrode of said current mirror output transistor and said voltage supply terminal, said resistor-capacitor low pass filter circuit being operative to make said output current at said output port equal to the frequency content of said input current as long as the frequency content of said input current is below the cut-off frequency defined by the time constant of said resistor-capacitor low pass filter circuit.

2. The current mirror circuit according to claim 1, wherein said current mirror input and output transistors are effectively matched devices, and voltage supply terminal-coupled resistors thereof have the same resistance values.

3. The current mirror circuit according to claim 1, wherein said current mirror input and output transistors are bipolar transistors.

4. The current mirror circuit according to claim 3, further including an additional bipolar transistor having an emitter coupled to the base of said current mirror input transistor, a base coupled to said input port, and a collector coupled to ground.

5. A current mirror circuit comprising:

an input port adapted to receive an input current;

an output port adapted to provide an output current;

a current mirror input transistor having an input electrode coupled through a first resistor to a voltage supply terminal, a control electrode coupled to receive a reference voltage, and an output electrode coupled to said input port; and a current mirror output transistor having an input electrode coupled through a second resistor to said voltage supply terminal, an output electrode coupled to said output port, and a control electrode; and wherein said control electrode of said current mirror input transistor is connected through a third resistor to the control electrode of said current mirror output transistor, and the control electrode of said current mirror output transistor is directly connected through a capacitor to said voltage supply terminal, said third resistor and said capacitor forming a resistor-capacitor low pass filter that is operative to make said output current at said output port equal to the frequency content of said input current as long as the frequency content of said input current is below the cut-off frequency defined by the time constant of said resistor-capacitor low pass filter.

6. The current mirror circuit according to claim 5, wherein said current mirror input and output transistors are effectively matched devices, and said first and second resistors have the same resistance values.

7. The current mirror circuit according to claim 5, wherein said current mirror input and output transistors are bipolar transistors.

8. The current mirror circuit according to claim 7, further including an additional bipolar transistor having an emitter coupled to the base of said current mirror input transistor, a base coupled to said input port, and a collector coupled to ground.

* * * * *

UNITED STATES PATENT AND TRADEMARK OFFICE
Certificate

Patent No. 6,545,540 B1                                                                  Patented: April 8, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Leonel Ernesto Enriquez, Melbourne Beach, FL; and Douglas L. Youngblood, Palm Bay, FL.

Signed and Sealed this Fifteenth Day of November 2005.

<div align="right">

ROBERT PASCAL
*Supervisory Patent Examiner*
Art Unit 2817

</div>